United States Patent [19]
Hotta

[11] Patent Number: 5,291,452
[45] Date of Patent: Mar. 1, 1994

[54] SENSING AMPLIFIER CIRCUIT FOR DATA READOUT FROM A SEMICONDUCTOR MEMORY DEVICE

[75] Inventor: Yasuhiro Hotta, Nara, Japan

[73] Assignee: Sharp Kabushiki Kaisha, Osaka, Japan

[21] Appl. No.: 827,326

[22] Filed: Jan. 29, 1992

[30] Foreign Application Priority Data

Feb. 13, 1991 [JP] Japan .................. 3-020078

[51] Int. Cl.$^5$ ............................................. G11C 11/34
[52] U.S. Cl. ..................... 365/208; 365/207; 365/227; 307/530
[58] Field of Search ............. 365/207, 208, 226, 227, 365/228, 229; 307/530, 355

[56] References Cited

U.S. PATENT DOCUMENTS

| | | | |
|---|---|---|---|
| 4,445,203 | 4/1984 | Iwahashi | 365/207 |
| 4,907,201 | 3/1990 | Minami et al. | 365/207 |
| 5,068,831 | 11/1991 | Hoshi et al. | 365/208 |

FOREIGN PATENT DOCUMENTS

| | | |
|---|---|---|
| 0409449A2 | 8/1993 | European Pat. Off. . |
| 0086188 | 4/1988 | Japan .................. 365/208 |
| 0171497 | 7/1988 | Japan .................. 365/208 |

OTHER PUBLICATIONS

1990 Symposium On VLSI Circuits, Jun. 1990, Honolulu USA, pp. 95-96, Nakai et al., 'A 36 ns 1 Mbit CMOS EPROM With News Data Sensing Technique'.

Primary Examiner—Eugene R. LaRoche
Assistant Examiner—Vu A. Le
Attorney, Agent, or Firm—Nixon & Vanderhye

[57] ABSTRACT

In a semiconductor memory device, two sense amplifiers are provided on one output signal line for reading data stored in a memory cell. The sense amplifiers are connected in parallel to each other. A control signal generation circuit generates a control signal so that one of the sense amplifiers which has a greater drive capability is activated during a predetermined time period after an address from which data are to be read out is changed, and that the sense amplifier having a smaller drive capability is activated during a time period other than the predetermined time period.

12 Claims, 7 Drawing Sheets

SENSING AMPLIFIER CIRCUIT FOR DATA READOUT FROM A SEMICONDUCTOR MEMORY DEVICE

BACKGROUND OF THE INVENTION

1. Field of the Invention

This invention relates to a semiconductor memory device such as a mask ROM (Read Only Memory), an EPROM (Erasable Programmable ROM) or an SRAM (Static Random Access Memory), and more particularly relates to a semiconductor memory device having an improved data read circuit.

2. Description of the Prior Art

In a semiconductor memory device, since data read out from a memory cell is a weak signal, the signal is amplified on an output signal line by a sense amplifier and then output. If the sense amplifier is always in an active state, the power consumption of the semiconductor memory device becomes too large. Therefore, in a conventional mask ROM or the like, after data read out from a memory cell is amplified by a sense amplifier and the read-out data becomes valid internally, the valid data is latched in a latch circuit. Thereafter, the sense amplifier is in an inactive state until the next read, whereby the power consumption is reduced.

A data read circuit in a mask ROM of the above-mentioned configuration is shown in FIG. 7. A memory cell 1 is arranged at each crossing of a number of word lines 2 and bit lines 3. Data stored in the memory cell 1 is input into a sense amplifier 6 through a bit line 3 via an FET 5 which is controlled by a column selection line 4. The data $S_{OUT}$ amplified by the sense amplifier 6 is latched in a latch circuit 7 and output via an output circuit 8 as output data $D_{OUT}$ of the ROM.

In this case, the sense amplifier 6 and the latch circuit 7 receive a sense signal $\Phi_{SA}$ and a latch signal $\Phi_{LT}$ from a timing generator (TG) circuit 9, respectively. As shown in FIG. 8, when the TG circuit 9 detects the change of an address signal A, the sense signal $\Phi_{SA}$ becomes High to activate the sense amplifier 6. The latch signal $\Phi_{LT}$ is at a High level during a short time period after the read-out data becomes valid internally, so as to allow the latch circuit 7 to latch the data $S_{OUT}$ output from the sense amplifier 6. When the data $S_{OUT}$ is latched at the rise of the latch signal $\Phi_{LT}$, the sense signal $\Phi_{SA}$ returns to Low so that the sense amplifier 6 is inactivated, whereby the power consumption of the sense amplifier 6 is suppressed until the next read. The read-out data latched in the latch circuit 7 can be output from the output circuit 8 as the output data $D_{OUT}$ for a predetermined period.

However, in the above configuration, in the case where the address signal A does not change at the first access after the power source $V_{cc}$ is turned on as shown in FIG. 9, the TG circuit 9 can not output the sense signal $\Phi_{SA}$ and the successive latch signal $\Phi_{LT}$, so that the output data $D_{OUT}$ continues invalid. In this case, the operation must be performed in such a complicated manner that a dummy cycle is carried out in order to change the address signal A after power is turned on, and then the regular address signal is output as shown in FIG. 10.

In the above-mentioned configuration in which the data read from the memory cell 1 is latched in the latch circuit 7 once and then output, when erroneous data is latched by a noise on a power supply line etc., the erroneous data is output as the output data $D_{OUT}$, without conversion.

As described above, a conventional semiconductor memory device has problems in that it requires a dummy cycle when the system is powered on, in order to suppress the power consumption of the sense amplifier 6, and that the probability of a data read error is prone to increase.

SUMMARY OF THE INVENTION

The semiconductor memory device of this invention, which overcomes the above-discussed and numerous other disadvantages and deficiencies of the prior art, comprises: a plurality of sense amplifiers provided on one output signal line for reading data stored in a memory cell, said sense amplifiers being connected in parallel to each other; and a control signal generation circuit for generating a control signal by which said sense amplifiers are selectively activated.

In a preferred embedment, the drive capability of at least one of said sense amplifiers is greater than that of at least other one of said sense amplifiers.

In the above configuration, said control signal generation circuit may generate said control signal so that said at least one sense amplifier having a greater drive capability is activated during a predetermined time period after an address from which data is to be read out is changed, and that said at least other one sense amplifier is activated during a time period other than said predetermined time period.

In a preferred embodiment, said sense amplifiers are differential type sense amplifiers.

In the above-mentioned configuration, the control signal generation circuit can activate one or more appropriate sense amplifiers when data is read out from a memory cell. For example, a sense amplifier with a high-amplification is selected and activated or a plurality of sense amplifiers are activated, so that the data can surely be output at a high speed, as in the prior art. After the read-out data becomes valid, the control signal is switched and a sense amplifier which has the same amplification but operates at a low speed with a low current consumption is selected and activated, whereby the power consumption can be suppressed as in the prior art. Alternatively, the number of sense amplifiers to be activated may be reduced.

Even after the read-out data becomes valid, it is unnecessary to latch the data in a latch circuit because at least one sense amplifier is activated. Therefore, the probability of latching erroneous data by a noise on a power supply line etc. is greatly reduced, and the increase in the probability of data read error can be prevented. Moreover, since any one of the sense amplifiers is activated when power is turned on, the disadvantage that a dummy cycle must be carried out is eliminated.

Thus, the invention described herein makes possible the objectives of:

(1) providing a semiconductor memory device which needs no latch circuit;

(2) providing a semiconductor memory device in which it is unnecessary to perform a dummy cycle when powered on; and (3) providing a semiconductor memory device in which the increase in the probability of data read error can be suppressed.

BRIEF DESCRIPTION OF THE DRAWINGS

This invention may be better understood and its numerous objects and advantages will become apparent to those skilled in the art by reference to the accompanying drawings as follows:

FIG. 9 is a time chart illustrating the operation of the data read circuit of the prior art when power is turned on.

FIG. 10 is a time chart illustrating the operation of the data read circuit of the prior art in a case where a dummy cycle is carried out when power is turned on.

DESCRIPTION OF THE PREFERRED EMBODIMENTS

Figure 7:
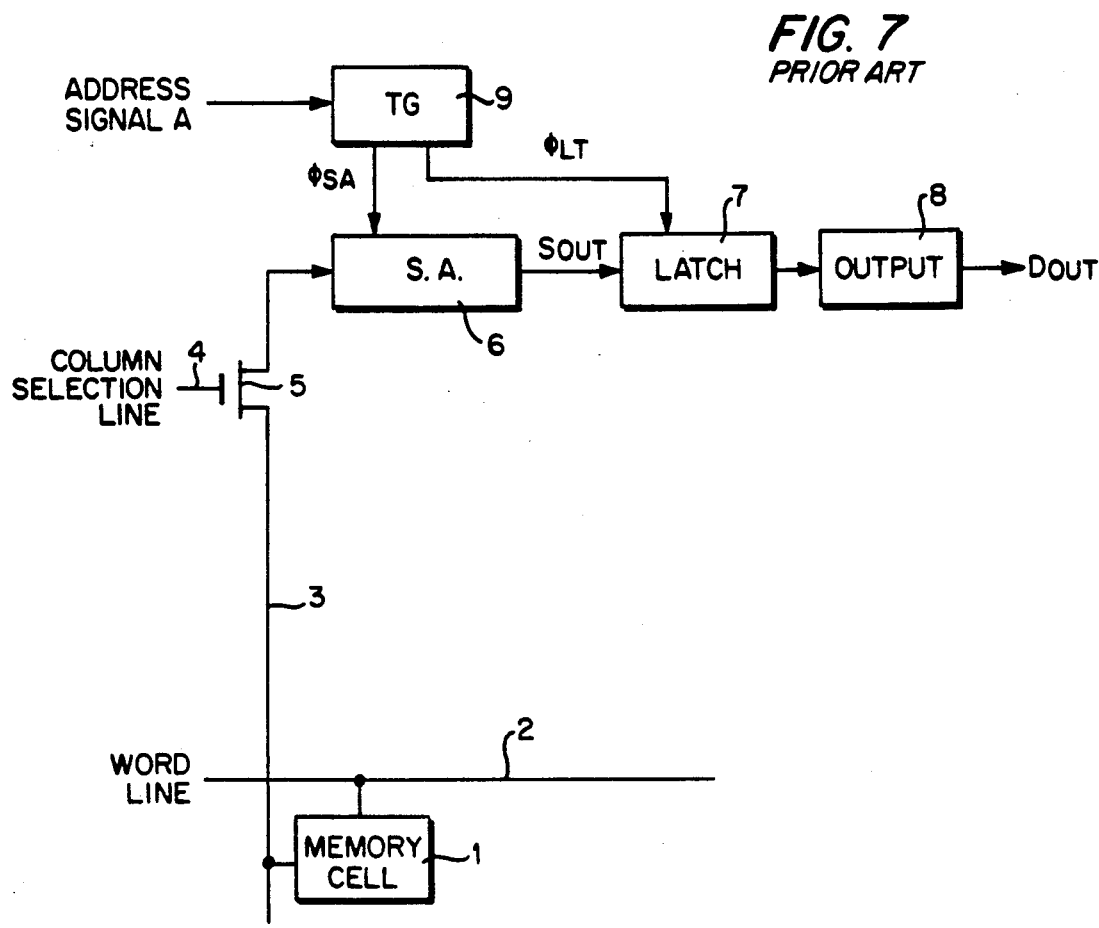
FIG. 7 is a block diagram showing a data read circuit in a prior art ROM.
Figure 8:
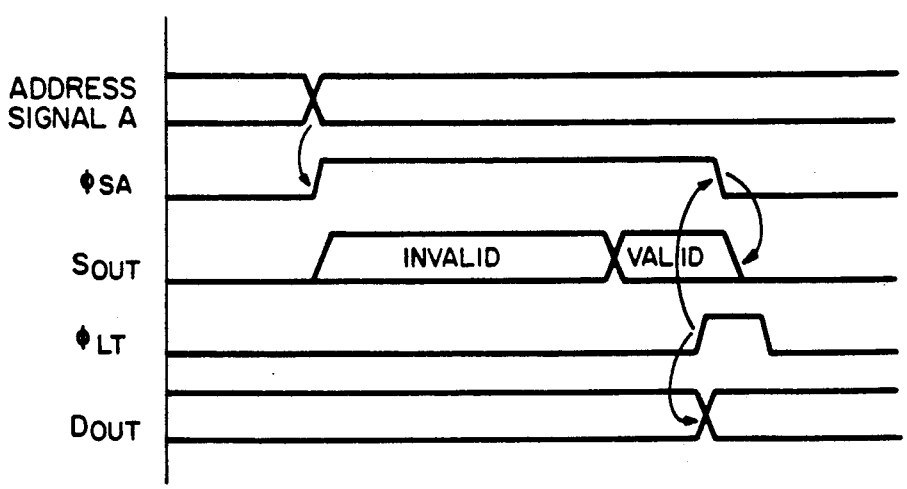
FIG. 8 is a time chart illustrating the operation of the data read circuit of the prior art.
Figure 9:
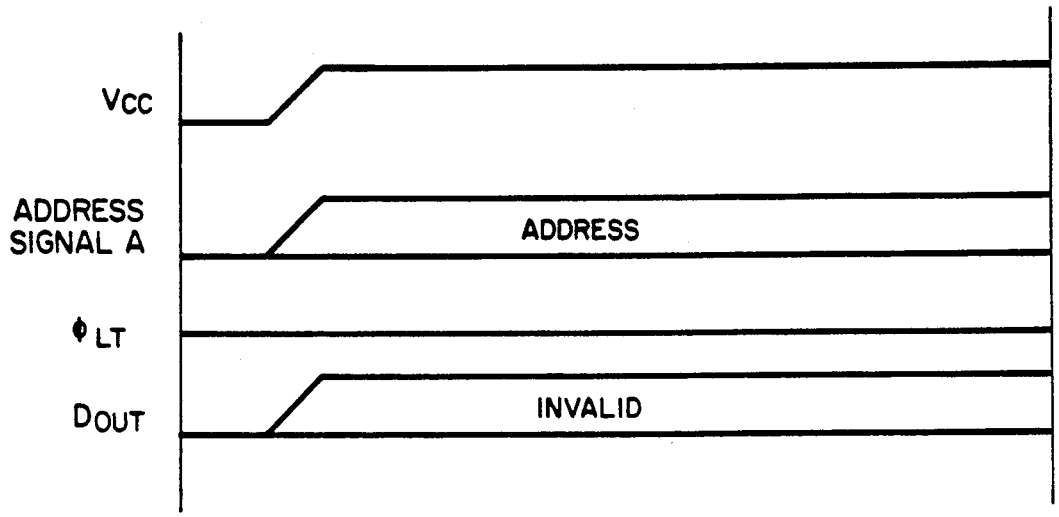
Figure 10:
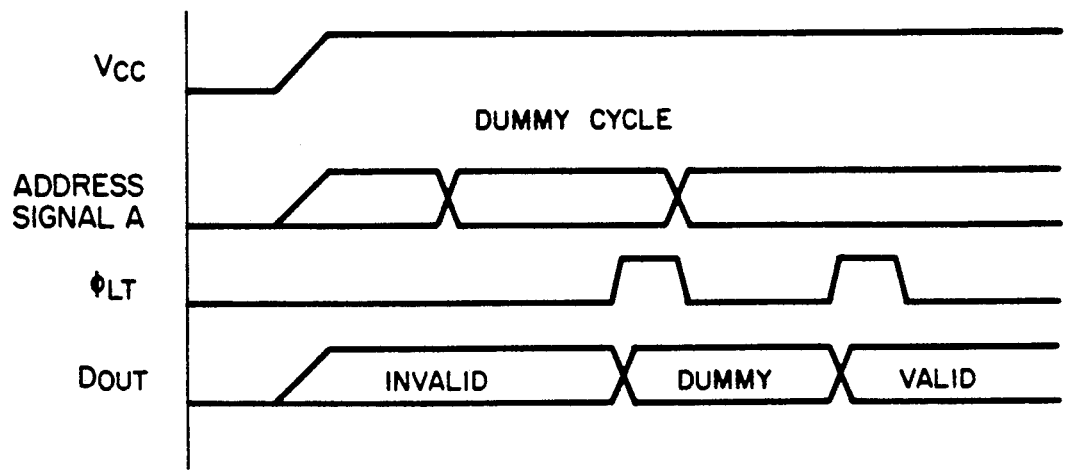

FIGS. 1 to 4 show one embodiment of the invention. This embodiment is a ROM, and like reference numerals represent like components having the same functions as those of the prior art shown in FIG. 7.

Figure 1:
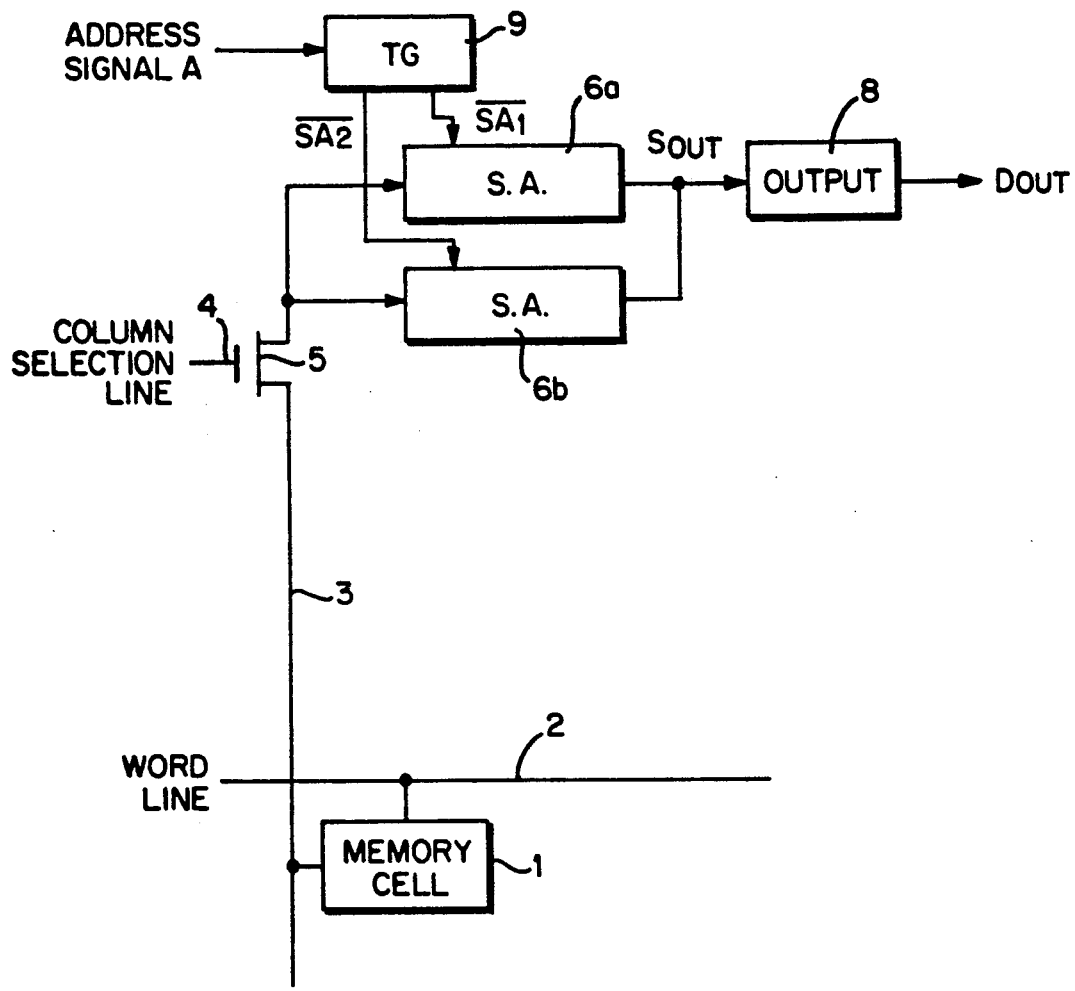
FIG. 1 is a block diagram showing one embodiment of the invention.

In the ROM of FIG. 1, a memory cell 1 is arranged at each crossing of a plurality of word lines 2 and bit lines 3. Each of the bit lines 3 is connected to sense amplifiers 6a and 6b via an FET 5 which is controlled by a column selection line 4. The sense amplifiers 6a and 6b are connected in parallel, and the outputs thereof are coupled to an output circuit 8. The output circuit 8 outputs output data $D_{OUT}$ as readout data of the ROM. The control output of a TG circuit 9 is connected to the sense amplifiers 6a and 6b which receive respectively a first sense signal $\overline{SA_1}$ (Low: active) and a second sense signal $\overline{SA_2}$ (Low: active).

Figure 2:
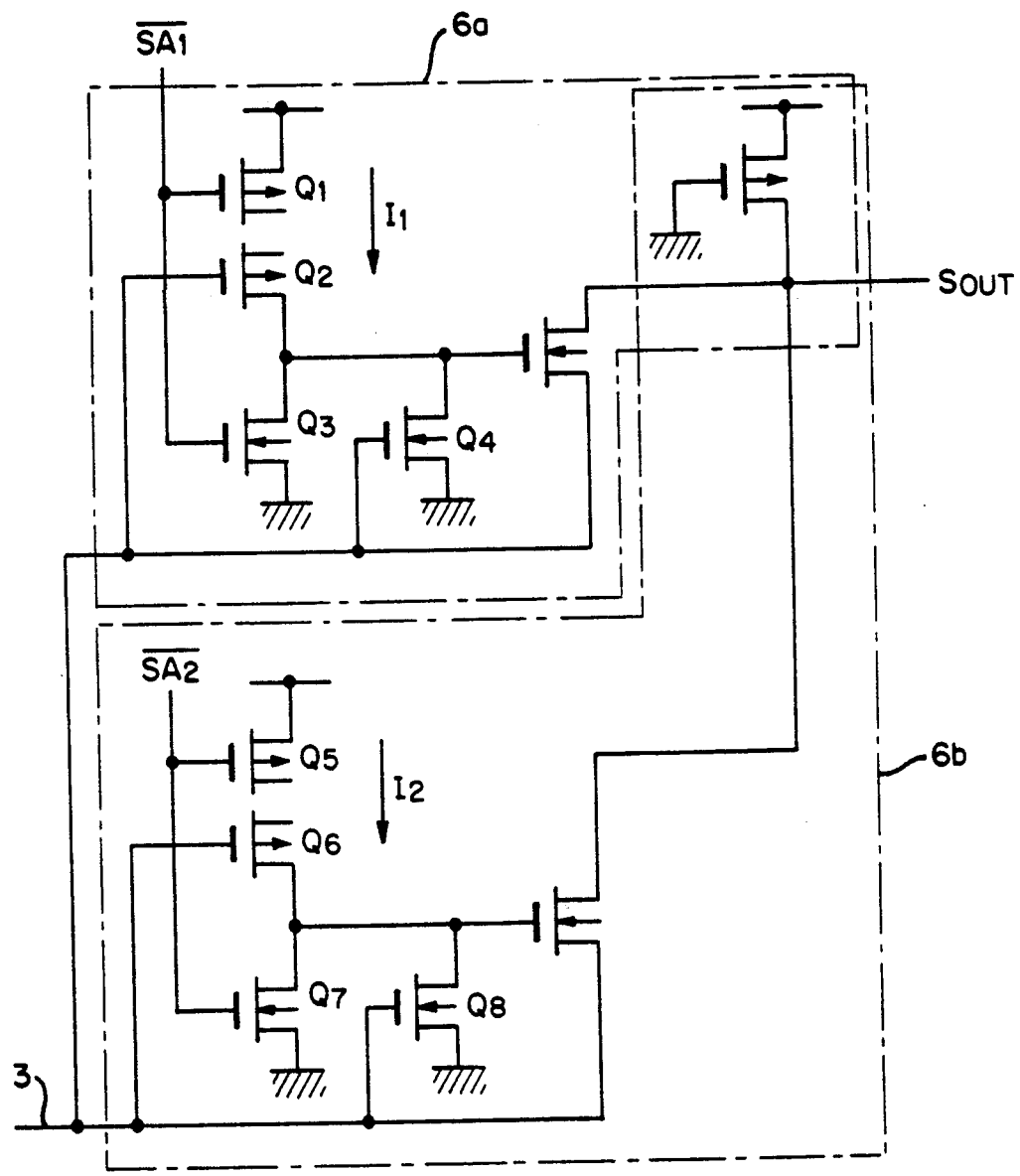
FIG. 2 is a circuit diagram showing a sense amplifier used in the embodiment of FIG. 1.
Figure 3:
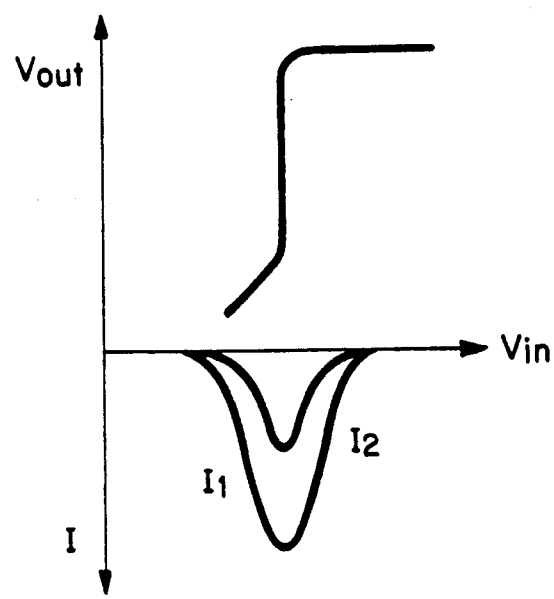
FIG. 3 is a graph illustrating the characteristics of the sense amplifier of FIG. 2.
Figure 4:
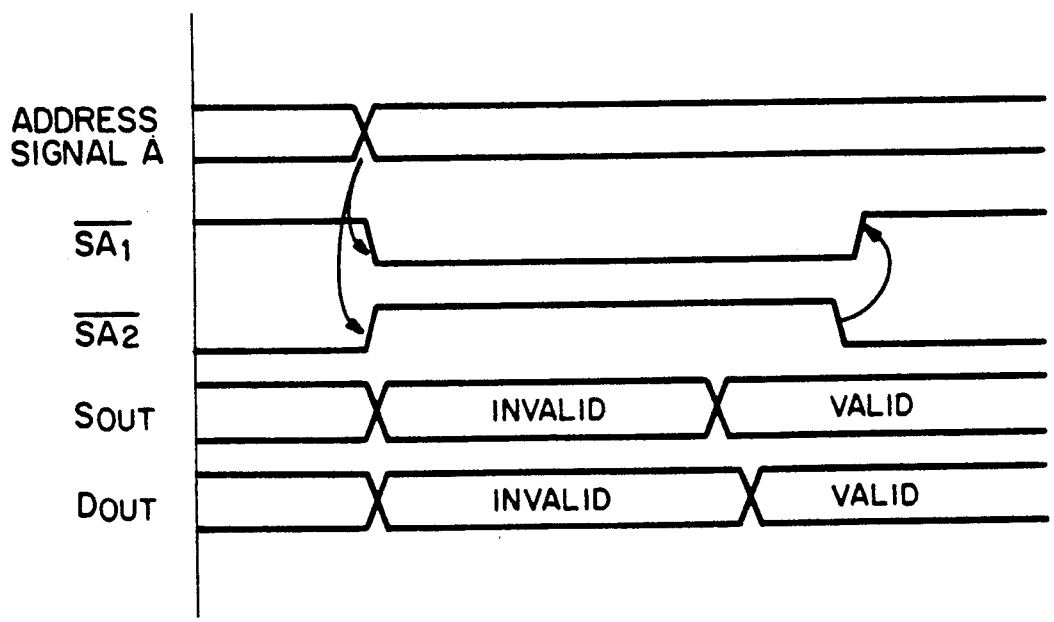
FIG. 4 is a time chart illustrating the operation of a data read circuit in the embodiment of FIG. 1.

The sense amplifiers 6a and 6b have MOSFETs which are arranged in a similar manner as shown in FIG. 2. When, in the sense amplifier 6a, the drive capability of p-MOS transistors $Q_1$ and $Q_2$ is indicated by $\beta_p$ and the drive capability of n-MOS transistors $Q_3$ and $Q_4$ by $\beta_n$, the drive capability of p-MOS transistors $Q_5$ and $Q_6$, and the drive capability of n-MOS transistors $Q_7$ and $Q_8$ are set to be $\beta_p/2$ and $\beta_n/2$, respectively, in the sense amplifier 6b. Accordingly, the sense amplifiers 6a and 6b have the same input-output voltage characteristics Vin-Vout, as shown in FIG. 3 In the vicinity of the logic threshold voltage, the current $I_2$ flowing through the sense amplifier 6b is half the current $I_1$ flowing through the sense amplifier 6a. amplifier 6b is half that of the sense amplifier 6a.

The operation of the data read circuit having the above-mentioned configuration will be described. When an address signal A is input into the ROM, a row of the memory cells 1 is first selected by one of the word lines 2. Then, one of the bit lines 3 is selected by a corresponding one of the column selection lines 4 so that the data stored in the selected memory cell 1 is sent to the respective sense amplifiers 6a and 6b from the bit line 3 via the FET 5. The TG circuit 9 detects the change of the address signal A so as to make the first sense signal $\overline{SA_1}$ Low and the second sense signal $\overline{SA_2}$ High. Thus, the sense amplifier 6a having a high drive capability is activated to amplify the read-out data and send it to the output circuit 8 as data $S_{OUT}$. In this way, the weak signal of the data stored in the memory cell 1 can surely be read out at a high speed by the sense amplifier 6a.

After the data $S_{OUT}$ thus read out becomes valid, the TG circuit 9 switches the levels of the first sense signal $\overline{SA_1}$ to High and the second sense signal $\overline{SA_2}$ to Low. That is, the sense amplifier 6a which has the high drive capability is inactivated and the other sense amplifier 6b is activated. Thereafter, the sense amplifier 6b outputs the data $S_{OUT}$ which is sent to the output circuit 8, whereby the power consumption of the ROM can be suppressed. The output circuit 8 outputs the output data $D_{OUT}$ as the read-out data of the ROM.

As a result, according to the embodiment, the sense amplifier 6b is in the active state after the read-out data becomes valid, and therefore it is not necessary to latch the data in a latch circuit as in the prior art, so that there is no probability of latching erroneous data by a noise on a power supply line etc. Moreover, since at least the sense amplifier 6b is activated when the system is powered on, data can surely be read out even if there is no change of the address signal A.

Figure 5:
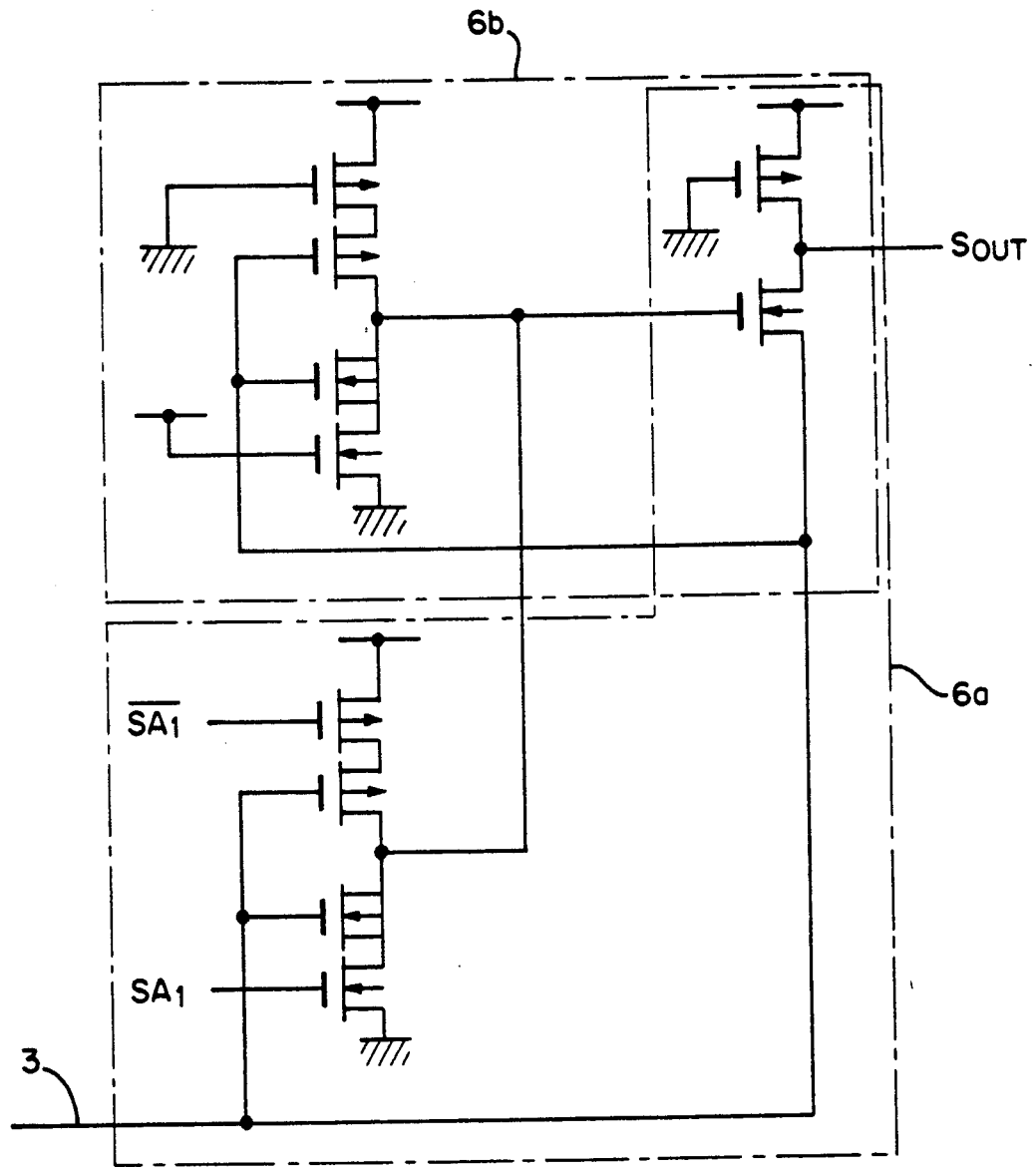
FIG. 5 is a circuit diagram showing a sense amplifier used in another embodiment of the invention.
Figure 6:
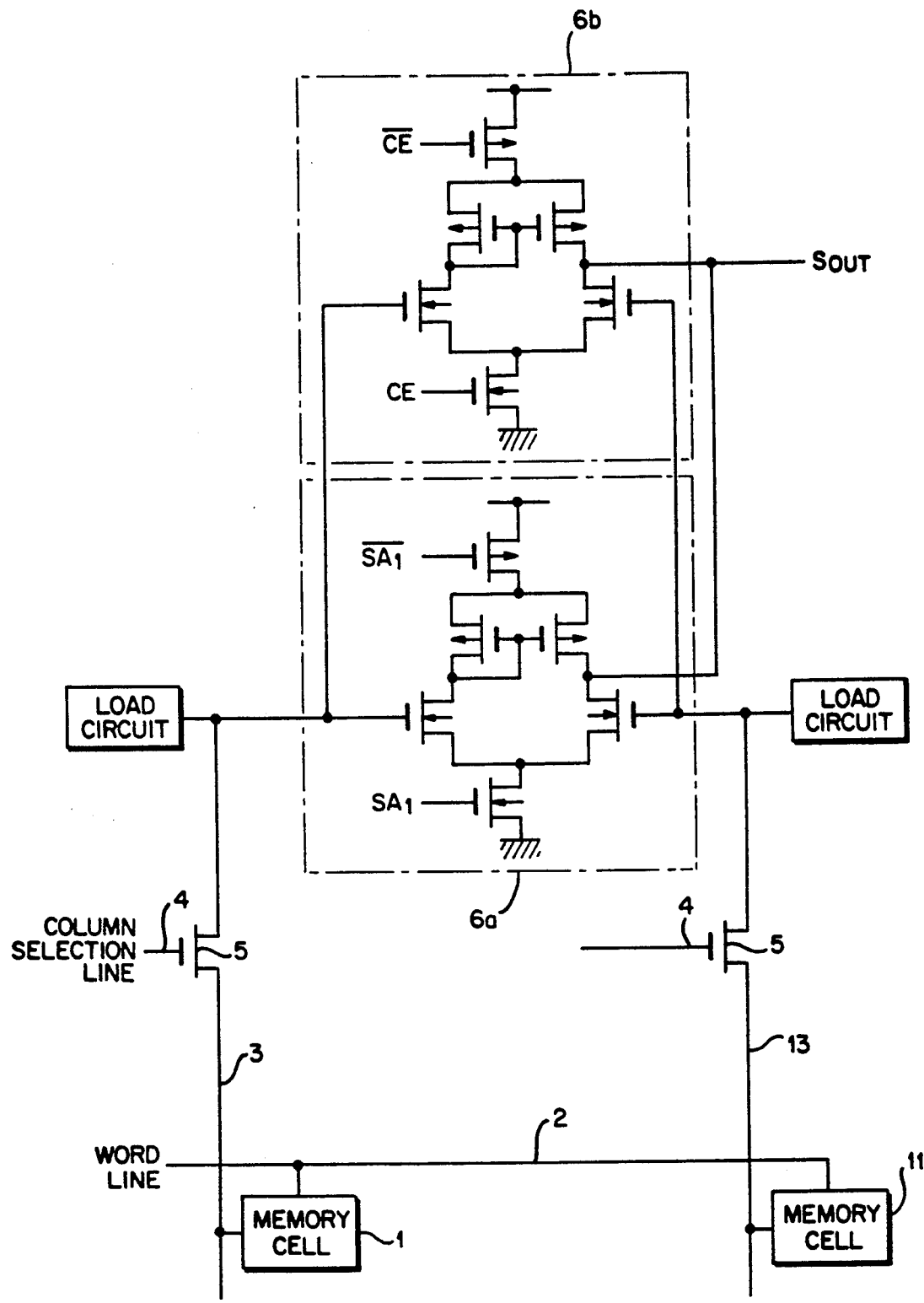
FIG. 6 is a block diagram showing a further embodiment of the invention.

Alternatively, the sense amplifiers 6a and 6b may have the configuration shown in FIG. 5, so as to reduce the number of elements. In this case, the sense amplifier 6b whose power consumption is low is always in the active state, and the activation of the sense amplifier 6a with a higher drive capability is controlled by the first sense signal $\overline{SA_1}$ and the inverse signal thereof. The sense amplifiers 6a and 6b can be constructed in the form of differential amplifiers as shown in FIG. 6. In this case, it is required to provide a dummy cell 11 having the same characteristics as those of the memory cell 1 at each dummy bit line 13, in order to generate a reference voltage.

As apparent from the above description, according to the semiconductor memory device of the invention, the power consumption can be suppressed without using a latch circuit, and hence there is no probability of latching erroneous data by a noise on a power supply line etc. and the increase in the probability of data read error can be prevented. Moreover, since any one of the sense amplifiers is activated when the power is turned on, a disadvantage that data can not be read unless a dummy cycle is carried out can be eliminated.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising:
   a plurality of sense amplifiers provided on one output signal line for reading data stored in a memory cell, said sense amplifiers being connected in parallel to each other; and a control signal generation circuit for generating a control signal by which said sense amplifiers are selectively activated.

2. A semiconductor memory device according to claim 1, wherein the drive capability of one of said sense amplifiers is greater than that of another one of said sense amplifiers.

3. A semiconductor memory device according to claim 2, wherein said control signal generation circuit generates said control signal so that said one sense amplifier having a greater drive capability is activated during a predetermined time period after an address from which data are to be read out is changed, and that said another sense amplifier is activated during a time period other than said predetermined time period.

4. A semiconductor memory device according to claim 1, wherein said sense amplifiers are differential type sense amplifiers.

5. A semiconductor memory device comprising:

a plurality of sense amplifiers provided on one output signal line for reading data stored in a memory cell, said sense amplifiers being connected in parallel to each other, and a control signal generation circuit for generating a control signal by which said sense amplifiers are selectively activated, wherein the drive capability of one of said sense amplifiers is greater than that of another one of said sense amplifiers, and wherein said control signal generation circuit generates said control signal so that said one sense amplifier having a greater drive capability is activated during a predetermined time period after an address from which data are to be read out is changed, and that said another sense amplifier is activated during a time period other than said predetermined time period.

6. A semiconductor memory with reduced power consumption, comprising:

first and second amplifiers connected in parallel to an output terminal of a memory cell, and a controller for generating a control signal for selectively activating one of the first and second amplifiers for only a portion of a memory read operation.

7. The semiconductor memory according to claim 6, wherein the first amplifier has a higher gain than the second amplifier, and the controller selectively activates the first amplifier and deactivates the second amplifier at the beginning of the memory read operation so that the amplifier amplifying a data signal read from the memory cell in accordance with the higher gain.

8. The semiconductor memory according to claim 7, wherein the controller deactivates the first amplifier after a valid read operation has occurred, and thereafter activates the second amplifier to amplify the data signal at a gain lower then the higher gain so that power is conserved.

9. The semiconductor memory according to claim 6, wherein the first amplifier consumes power at a level greater than that consumed by the second amplifier.

10. The semiconductor memory according to claim 9, wherein the second amplifier is automatically and continuously activated whenever the semiconductor memory is powered on, and the controller selectively activates the first amplifier only during a portion of the memory read operation.

11. The semiconductor memory according to claim 6, wherein the first and second amplifiers are constructed as differential amplifiers.

12. The semiconductor memory according to claim 11, further comprising another memory cell for generating a reference signal.

* * * * *

UNITED STATES PATENT AND TRADEMARK OFFICE
CERTIFICATE OF CORRECTION

PATENT NO. : 5,291,452
DATED : March 1, 1994
INVENTOR(S) : Yasuhiro Hotta

It is certified that error appears in the above-indentified patent and that said Letters Patent is hereby corrected as shown below:

Column 6, lines 13 and 18, change "deactivates" to
 --inactivates--.

Column 6, line 15, before "amplifier", insert --first--.

Signed and Sealed this

Ninth Day of August, 1994

Attest:

BRUCE LEHMAN

*Attesting Officer*  *Commissioner of Patents and Trademarks*